(12) United States Patent
Bert et al.

(10) Patent No.: US 10,825,855 B2
(45) Date of Patent: Nov. 3, 2020

(54) FLEXIBLE X-RAY SENSOR WITH INTEGRATED STRAIN SENSOR

(71) Applicant: Palo Alto Research Center Incorporated, Palo Alto, CA (US)

(72) Inventors: Julie A. Bert, East Palo Alto, CA (US); Robert A. Street, Palo Alto, CA (US); John C. Knights, Soquel, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 34 days.

(21) Appl. No.: 16/218,905

(22) Filed: Dec. 13, 2018

(65) Prior Publication Data

US 2020/0194489 A1    Jun. 18, 2020

(51) Int. Cl.
   *H01L 27/146*        (2006.01)
   *G01B 7/16*          (2006.01)
   *H01L 29/786*        (2006.01)
   *H04N 5/32*          (2006.01)

(52) U.S. Cl.
CPC .......... *H01L 27/14663* (2013.01); *G01B 7/18* (2013.01); *H01L 29/78663* (2013.01); *H04N 5/32* (2013.01)

(58) Field of Classification Search
CPC ........ H01L 27/14663; H01L 29/78663; G01B 7/18; H04N 5/32
See application file for complete search history.

(56) References Cited

U.S. PATENT DOCUMENTS

| | | | |
|---|---|---|---|
| 6,856,670 B2* | 2/2005 | Hoheisel | H01L 27/14658 250/370.09 |
| 10,608,041 B2 | 3/2020 | Street et al. | |
| 2003/0031296 A1* | 2/2003 | Hoheisel | G01T 1/2018 378/98.8 |
| 2006/0180768 A1 | 8/2006 | Bogdanovich et al. | |
| 2007/0025513 A1 | 2/2007 | Ghelmansarai | |
| 2007/0053498 A1* | 3/2007 | Mandelkern | A61B 6/145 378/184 |
| 2008/0151084 A1* | 6/2008 | Lu | G06K 9/209 348/294 |
| 2008/0151089 A1* | 6/2008 | Street | H01L 27/14601 348/308 |
| 2012/0031192 A1 | 2/2012 | Duenas et al. | |
| 2013/0154039 A1* | 6/2013 | Furui | G01T 1/2018 257/428 |
| 2015/0137088 A1 | 5/2015 | Simon et al. | |
| 2016/0049441 A1 | 2/2016 | Shieh et al. | |
| 2017/0264837 A1* | 9/2017 | Jang | H04N 5/357 |
| 2019/0079201 A1 | 3/2019 | Street et al. | |

\* cited by examiner

*Primary Examiner* — Blake C Riddick
(74) *Attorney, Agent, or Firm* — Fay Sharpe LLP

(57) ABSTRACT

Bending a flexible x-ray detector to image a curved structure or object will distort the object appearance when compared to an image captured by a flat/rigid detector. An image distortion of this type can be corrected when the shape (relative bend position) of the x-ray detector is known. Incorporating strain sensors on the flexible x-ray detector makes it possible to record the local bend of the flexible x-ray detector when an image is taken. This shape information can be used to either label or correct for the image distortions created by bending the x-ray detector to assist users more accustomed to viewing images produced by flat/rigid x-ray detectors.

18 Claims, 9 Drawing Sheets

FLEXIBLE X-RAY SENSOR WITH INTEGRATED STRAIN SENSOR

BACKGROUND

Digital x-ray detectors, also called herein x-ray imagers have generally been fabricated on glass using an amorphous silicon (a-Si) thin film transistor (TFT) array which addresses an array of a-Si photodiodes. Such TFT addressed photodiode array will at times be referred to herein as a backplane. An x-ray scintillator is placed in contact with the backplane to down convert x-rays to light that can be detected by the photodiodes. The scintillator is typically either Tb-doped gadolinium oxysulphide (GOS) or cesium iodide (CsI), but other materials may also be used. While the GOS scintillator may be bonded to the backplane, the GOS scintillator may also not be bonded to the backplane but instead pushed into contact therewith. The CsI scintillator may also be deposited directly on the backplane or alternatively formed as a separate layer and adhesively bonded or pushed into contact. An alternative approach, which eliminates the need for a separate scintillating layer, is to use an x-ray photoconductor such as selenium to form photodiodes which are then addressed by a very similar TFT array. The current disclosure applies to either type of structure.

As known in the art, the same backplane structures can be deposited on a plastic/flexible substrate instead of glass. There are various ways to make a backplane on a flexible substrate. One procedure known in the art is to form a thin polyimide (PI) layer on a conventional glass substrate. A second method known in the art is to bond a thicker plastic substrate such as PEN (Polyethylene naphthalate) to a glass carrier. In both cases, the backplane is then manufactured with the same process as if it were on glass without the thin substrate layer. After the processing is complete, the scintillator is bonded or deposited on the front surface to give support to the thin substrate film and the a-Si backplane layers. The combination is then released from the glass substrate and a backing layer can be bonded to the back side for additional protection. The flexible nature of plastic substrates, adhesive bonding material and GOS scintillator make the x-ray detector or imager bendable.

Bendable x-ray detectors are of interest in a variety of areas. Some examples include: inspection of pipelines or other curved objects, imaging objects in confined spaces where rigid flat x-ray detectors cannot be introduced, and to conform to the human body for added comfort and resolution.

However, an issue associated with bendable x-ray detectors, is that when the bendable x-ray detector is in a bent position (e.g., while in contact with a curved object or structure being imaged) the resulting image will have a different resolution or magnification and therefor a different appearance when compared to an image captured by a flat and/or rigid x-ray detector. The present application is directed to addressing this issue.

INCORPORATION BY REFERENCE

U.S. patent application Ser. No. 15/951,407 Filed Apr. 12, 2018, titled: Bendable X-Ray Detector With TFT Backplane In the Neutral Plane is hereby incorporated by reference in its entirety.

BRIEF DESCRIPTION

A digital bendable x-ray detector includes a flexible substrate, a detector backplane formed on the flexible substrate, and one or more x-ray conversion layers. The x-ray detector having a first side directed towards an x-ray source and a second side directed away from the x-ray source. Further, an arrangement of multiple strain sensors are attached to the x-ray detector, wherein the arrangement of the multiple strain sensors provide data regarding the location and amount of bend occurring when the digital bendable x-ray detector is acquiring image data concerning a structure or object being imaged.

The x-ray detector includes the arrangement of strain sensors being configured to be measured simultaneously with an image acquisition to extract the bend shape of the x-ray detector when an image is acquired.

The detector includes the arrangement of strain sensors being positioned along two orthogonal axes oriented to the edges of a substrate to detect the bend shape along either or both axes.

The x-ray detector includes multiple rows of strain sensors of various sizes used to achieve both high sensitivity and high resolutions of the bend shape.

The x-ray detector has the strain sensors are located on the second side of the detector at a position that does not interfere with image acquisition.

The x-ray detector has the strain sensors subsequently fabricated on the detector.

The x-ray detector has the strain sensors fabricated simultaneously with the detector backplane fabrication process on the first side of the detector in regions outside the active detector imaging area.

The x-ray detector has strain sensors which are fabricated simultaneously with the detector backplane fabrication process on the first side of the detector under the active detector imaging area.

The x-ray detector has strain sensors which are fabricated simultaneously with the detector backplane fabrication process on the first side of the detector and interspersed within the active detector imaging area.

The x-ray detector has the strain sensors fabricated simultaneously with the detector backplane fabrication process on the first side of the detector in regions outside the active detector imaging area and then an area with the strain sensors is folded over to reduce dead area.

The x-ray detector has the strain sensors externally fabricated and subsequently bonded to the detector.

The x-ray detector has the strain sensors positioned at a location within the vertical stack-up to experience a maximum strain provided to the x-ray detector.

The x-ray detector has the location of the strain sensors on an outer surface of a supporting layer of the x-ray detector.

The x-ray detector has a first array of TFTs associated with the detector backplane, and a second array of TFTs associated with the strain sensors, and wherein the first array of TFTs and the second array of TFTs are separate from each other.

A method of detecting a curve of a bendable x-ray detector as the x-ray detector is acquiring image data of a structure or object includes positioning a bendable x-ray detector in a curved position to acquire image data of a structure or object reading out data from an arrangement of multiple strain sensors attached or integrated with a layer of the x-ray detector, wherein the data corresponds to an amount of strain caused to the multiple strain sensors by the bending of the bendable x-ray detector corresponding to the shape of the structure or object.

The method includes having the arrangement of multiple strain sensors configured to be measured with image acquisition by the x-ray detector, to extract the bend shape of the x-ray detector when an image is acquired.

The method includes having the simultaneous measuring include obtaining and recording the resistance change of the multiple strain sensors.

DETAILED DESCRIPTION

As to be understood, the present application is directed to issues related to bendable digital x-ray detectors (also called herein x-ray imagers). An x-ray imager is used with an x-ray source to capture an x-ray absorption image of an object. The object to be imaged is placed between the x-ray detector and source. The x-ray source emits x-ray radiation which passes through the object and is absorbed by the object at a rate that depends exponentially on the thickness and the x-ray attenuation coefficient of the material in the object. This intensity variation in x-ray radiation strikes an x-ray conversion layer of the detector where it is either directly converted to charge carriers when the x-ray conversion layer is a photoconductor (such as Se or $HgI_2$) or indirectly converted to charge carriers when the converter layer is a scintillator and the detector backplane includes an array of photodiodes. The invention applies to both direct and indirect detection detectors. The accumulated charge can be measured by charge amplifiers, digitized by an analog to digital converter, and assembled into a digital image by a computing device.

Figure 1A:
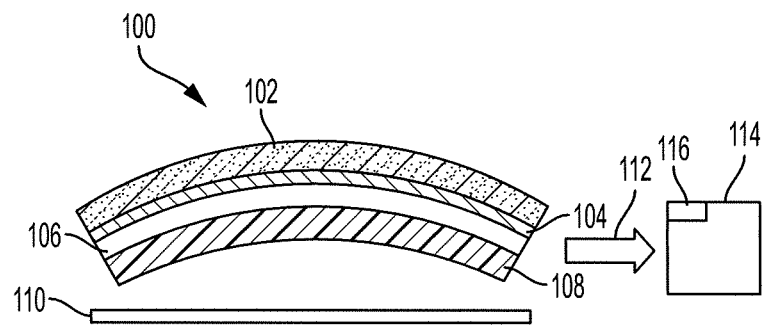
FIG. 1A illustrates a bendable x-ray detector structure after deposition on a flexible film and subsequent bonding to the scintillator and the underside protection layer.

To more fully describe such devices attention is directed to FIG. 1A, which provides a non-limiting description of a bendable digital multilayer x-ray detector 100 appropriate for the present disclosure. More particularly, FIG. 1A illustrates layers of the indirect detection multilayer x-ray detector 100 when it is bent or curved. Multilayer x-ray detector 100 includes, a scintillator x-ray conversion layer 102 (e.g., a GOS, CsI, or other appropriate material), a-Si detector backplane 104 (e.g., including an amorphous silicon (a-Si) thin film transistor (TFT) array arrangement, and a corresponding a-Si photodiode array arrangement, along with associated metal electrodes, interconnects and contact lines), a substrate layer 106 (e.g., a PI substrate) which is understood to be the x-ray detector substrate, and an optional underside protection layer 108 (e.g., a flexible plastic material, such as but not limited to polycarbonate, or other polymer). To further describe the present concepts also depicted in FIG. 1A is a glass manufacturing substrate 110 (or other appropriate material) on which at least some of the layers described above are deposited during the manufacturing process, and thereafter such layers are released. It is understood that prior to release from the glass manufacturing substrate 110 the deposited layers are substantially planar or flat and may remain flat after release until acted upon in some manner by an external force.

FIG. 1A also depicts data output lines 112 which supply data generated by x-ray detector 100 to a computing device 114. It is understood the computing device 114 is a stand-alone computer, a computing device integrated with the x-ray detector 100 or any other type of computing device loaded with software appropriate to generate and save a captured image. The generated image being of the form that may be displayed on a display 116 that is part of the computing device and/or distinct therefrom.

Figure 1B:
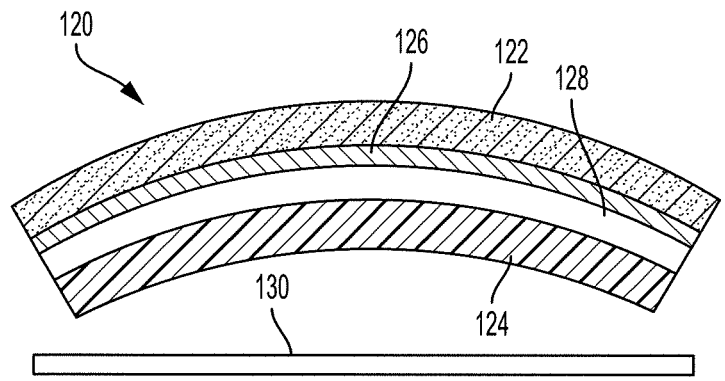
FIG. 1B illustrates a bendable x-ray detector structure having multiple scintillator layers.

Turning to FIG. 1B, illustrated is another multi-layer x-ray detector structure to which the present concepts are applicable. More particularly, the multilayer digital x-ray detector structure 120 of FIG. 1B includes scintillators layers 122, 124 on opposite sides of the detector structure 120, which also includes detector backplane layer 126, and device substrate 128 (e.g., PI substrate). This configuration provides an increased total scintillator thickness, and hence higher sensitivity, for a particular spatial resolution when compared to a single scintillator device. Also shown is a glass manufacturing substrate 130.

Figure 1C:
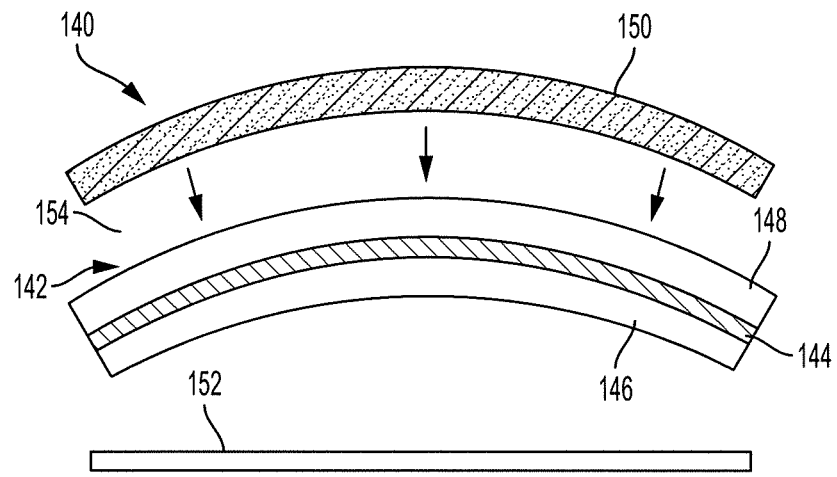
FIG. 1C illustrates a bendable x-ray detector structure non-bonded to a flexible layer.

Turning to FIG. 1C, illustrated is another embodiment of a multi-layer digital x-ray detector structure 140 according to the present disclosure. In this configuration formed is a multilayer arrangement 142, which includes a detector backplane 144, positioned between a flexible or bendable device substrate 146, and another flexible layer or film 148, and a scintillator 150. It is shown that scintillator 150 is not bonded to the flexible layer 148 (e.g., PI layer or film) prior to removal of the substrate 146 from the temporary manufacturing glass substrate 152 on which the multilayer arrangement 142 is formed. Instead, in this embodiment, once substrate 146, and detector backplane layer 144 have been formed (while attached to the temporary building substrate 152) then the other layer 148 is deposited to this construction on the front side of the detector backplane layer 144. The scintillator 150 is then moved 154 into contact with the flexible layer 148.

Figure 1D:
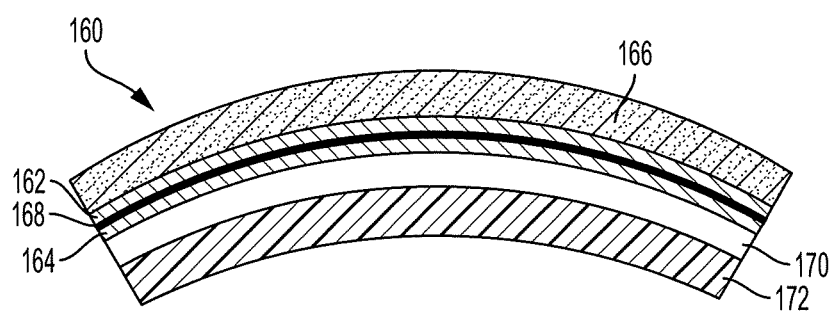
FIG. 1D illustrates a bendable x-ray detector structure having multiple bendable x-ray detector backplanes.

Turning to FIG. 1D, another embodiment of the present disclosure is depicted by multilayer digital x-ray detector structure 160, which includes bendable x-ray detector backplanes 162, 164, arranged to enable energy resolution. As x-rays pass through a scintillator 166, some are absorbed, and some are transmitted. Generally, the higher energy x-rays are preferentially transmitted, but this depends on the specific scintillator, which typically has a maximum absorption at a specific energy (the k-edge absorption). Therefore, as shown by arrangement 160, second x-ray detector backplane 164 placed behind the first x-ray detector backplane 162 will detect a different x-ray energy distribution. Moreover, an absorber material 168 is optionally placed between the two detector backplanes 162, 164 to block a range of x-ray energies. The detector backplane and the second detector backplane arrangement include x-ray shielding to provide energy resolution information. Also included is a substrate 170, and an underside protection layer 172.

It is understood the teachings of the present application are not limited by the imager embodiments of FIGS. 1A-1D. Particularly, on a more general level taking FIG. 1A as an example, the scintillator layer 102 may be configured as a different type of layer and similarly the substrate layer 106 can be considered also on a more general level as a layer different from a substrate layer. Therefore, at certain times such layers are called arrangements or arrangement layers which are associated with the detector backplane 104; which itself may, in certain embodiments be different than an a-Si detector. Additionally, in FIGS. 1A-1D (and the remaining figures, e.g., 2-14) the variously described x-ray detectors have a first side directed towards an x-ray source (not shown in FIGS. 1A-1D but shown in FIGS. 2-4) and a second side directed away from the x-ray source.

An issue related to such a bendable x-ray detector (and other relevantly designed x-ray detectors) 100, is that bending of such x-ray detector 100 (e.g., while a curved structure or object is being imaged) results in a distortion of the appearance of the curved structure or object when compared to an image captured by a flat and/or rigid detector. Though the intimate contact achieved by a curved imager will result in improved resolution and magnification of features in the image, users trained on rigid flat panel detectors may prefer or be accustomed to interpreting images captured on rigid flat panel with their associated distortions (described below). Image distortion for a curved design can be corrected, such as by software employed for image generation, if the shape (i.e., a relative bend position or amount of bend) of the x-ray detector is known. Therefore, it is desirable to record the bend position of a flexible imager so geometric modifications to the image can be applied to mimic a flat panel imager. This will give the user both access to the enhanced resolution enabled by the flexible panel, while still providing the ability to produce images the user is accustomed to interpreting.

The image distortion between a flexible curved and rigid flat panel is caused by the non-zero distance between an object and the detecting panel and will have a different impact depending on if a diverging or collimated x-ray source is used.

Most sources of x-rays are not point-like, but instead produce diverging radiation beams that emanate from a finite source area. When this type of source is used with rigid flat panel detectors to image curved objects, for example, the resulting images suffer from geometric unsharpness. Geometric unsharpness refers to a loss of definition or blurring due to geometric factors in the radiographic imaging set-up. X-rays that emanate from different points in the source area can pass through the same point in the object yet strike the imager at different points, blurring the image. The geometric unsharpness, $U_g$, can be calculated using the following formula, $$U_g = f \frac{b}{a},$$

where f is the diameter of the x-ray source, b is the distance between the object and the detector and a is the distance between the object and the x-ray source.

Figure 2:
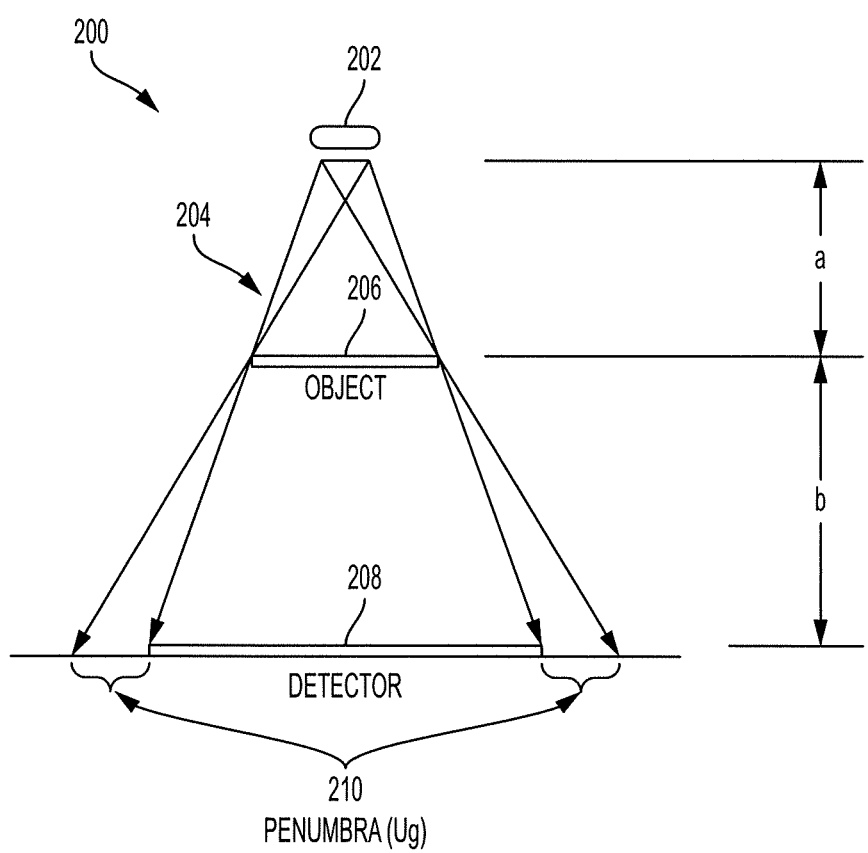
FIG. 2 illustrates a system explaining geometric unsharpness.

The foregoing concept of "unsharpness" is illustrated, for example, by system 200 shown in FIG. 2. An extended light source (or diverging light source) 202 generates light beams 204 which are emitted from different points whereby the light beams 204 extend at angles (i.e., non-parallel). In this manner, as the beams 204 extend, two beams may pass through an object 206 at the same point but due to the different angles of travel, the beams encounter or strike imager or detector 208 at different locations blurring an image. Some of the light beams do not encounter the imager or detector 208, but rather form a penumbra 210. It is understood only a small sampling of beams are shown for clarity reasons.

A benefit of using a bendable x-ray detector is that the x-ray detector can be placed in direct contact with a curved object being imaged. Placing the imager in contact with the object greatly reduces the geometric unsharpness associated with imaging a curved object with a rigid flat-panel imager. By using a bendable detector b can be reduced to the thickness of the material minimizing the geometric unsharpness.

As mentioned, an extended light source (or diverging light source) is commonly used to generate absorption images of an object. A diverging light source generates x-rays that are non-parallel to each other, illustrated by beams 204 in FIG. 2. When using a diverging source to image a cylindrical object, the image distortion is manifested as a geometric magnification that depends on the angle between the center of the cylinder being imaged and the incoming x-ray.

Figure 3:
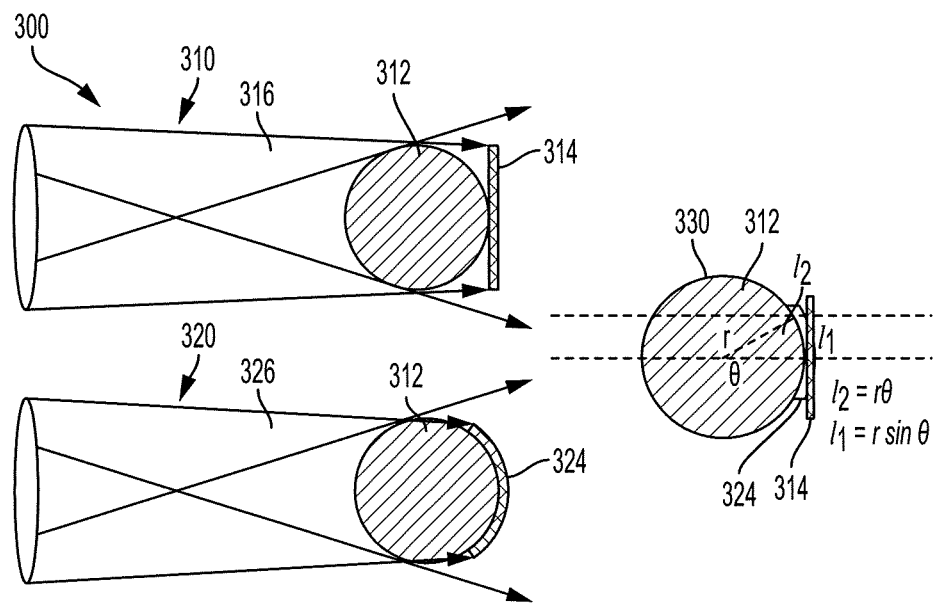
FIG. 3 illustrates bending of an x-ray detector to image a curved object (using diverging x-rays) which distorts the object's appearance when compared to an image captured by a rigid and/or flat x-ray detector, where distortion of this type can be corrected when the shape (relative bend position) of the x-ray detector is known.

To illustrate this distortion concept, attention is directed to system 300 of FIG. 3, which includes sub-image 310, depicting a pipe 312, a flat x-ray detector 314, and x-rays 316; sub-image 320, depicting the pipe 312, a curved (bendable) x-ray detector 324, and x-rays 326; and sub-image 330, depicting the pipe 312, the flat x-ray detector 314, and the curved x-ray detector 324, and equations describing the relative location of an image of a feature of the pipe on a flat panel, $l_1$, and bendable, $l_2$, detector.

A pipe image generated according to sub-image 320, where the curved x-ray detector 324 is bent around the pipe 312 will appear larger than the same pipe 312, imaged using the flat x-ray detector 314 of sub-image 310, where the flat x-ray detector 314 is placed tangent to the pipe 312.

The equations shown in sub-image 330 demonstrate that this enlarging effect is caused by the fact that x-ray photons that pass through the same portion of the pipe 312 will strike different positions on the flat x-ray detector 314 and curved x-ray detector 324. These positions are labeled $l_1$ for the flat x-ray detector 314 and $l_2$ for the curved x-ray detector 324, and are set by the radius of curvature of the x-ray detector, r. The equations demonstrate that $l_2$ will always be greater than or equal to $l_1$, which means more backplane array pixels (e.g., photodiode array) will be used to image the same length of pipe with curved x-ray detector 324, than with flat x-ray detector 314, creating a magnification of the structure or object being imaged The curvature of the image sensor can be measured using a position sensing arrangement. Non-limiting examples of such position sensing designs implemented using strain sensor arrangements are detailed herein.

So for the case of reducing geometric unsharpness when using a diverging source, this magnification effect is a benefit of bending a bendable x-ray detector 324 around an object. As such bending effectively increases the resolution of the bendable x-ray detector 324 and makes the features in an image effectively larger.

Collimated x-rays can also be used to generate absorption images of an object. Unlike a diverging source, a collimated x-ray source generates x-rays that are substantially parallel to each other, indicated by 416 and 426 in FIG. 4. When using a collimated source to image a cylindrical object the image distortion is manifested as a geometric magnification that depends on the angle between the center of the cylinder being imaged and the incoming collimated x-ray similarly, as discussed above.

Figure 4:
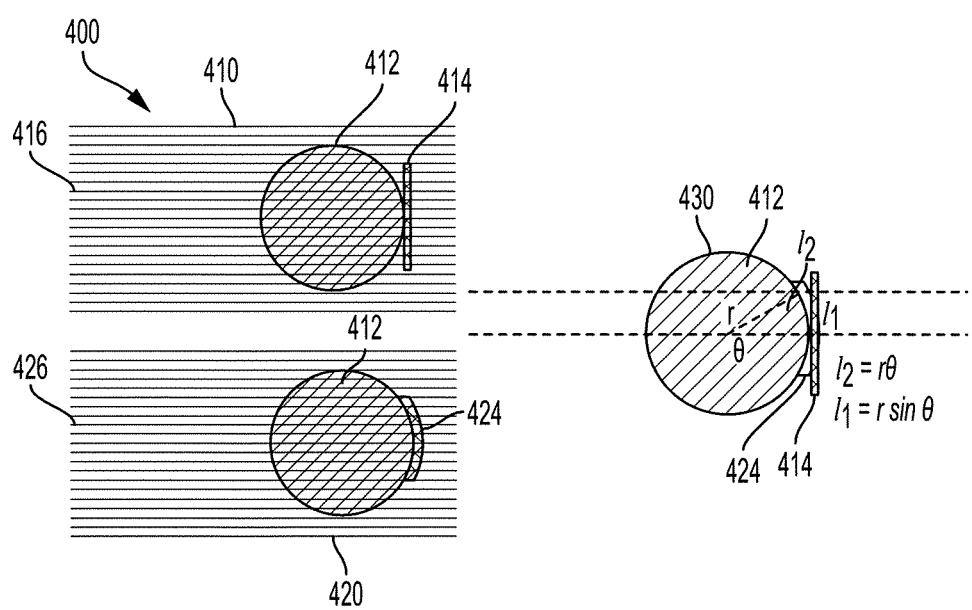
FIG. 4 illustrates bending of an x-ray detector to image a curved object (using collimated x-rays) which distorts the object's appearance when compared to an image captured by a rigid and/or flat x-ray detector, where distortion of this type can be corrected when the shape (relative bend position) of the x-ray detector is known.

To illustrate this distortion concept, attention is directed to image 400 of FIG. 4, which includes sub-image 410, depicting a pipe 412, a flat x-ray detector 414, and x-rays 416; sub-image 420, depicting the pipe 412, a curved (bendable) x-ray detector 424, and x-rays 426; and sub-image 430, depicting the pipe 412, the flat x-ray detector 414, and the curved x-ray detector 424 and equations describing the relative location of an image of a feature of the pipe on a flat panel, $l_1$, and bendable, $l_2$, detector.

A pipe image generated according to sub-image 420, where the curved x-ray detector 424 is bent around the pipe 412 will appear larger than the same pipe 412, imaged using the flat x-ray detector 414 of sub-image 410, where the flat x-ray detector 414 is placed tangent to the pipe 412.

The equations shown in sub-image 430 demonstrate that this enlarging effect is caused by the fact that x-ray photons that pass through the same portion of the pipe 412 will strike different positions on the flat x-ray detector 214 and curved x-ray detector 424. These positions are, again, labeled $l_1$ for the flat x-ray detector 414 and $l_2$ for the curved x-ray detector 424, and are set by the radius of curvature of the x-ray detector, r. The equations demonstrate that $l_2$ will always be greater than or equal to $l_1$, which means more backplane array pixels (e.g., photodiode array) will be used to image the same length of pipe with curved x-ray detector 424, than with flat x-ray detector 414, creating a magnification of the structure or object being imaged The curvature of the image sensor can be measured using a position sensing arrangement. Non-limiting examples of such position sensing designs implemented using strain sensor arrangements are detailed herein.

Similar to the case of reducing geometric unsharpness when using a diverging source, this magnification effect when using a collimated source is a benefit of bending a bendable x-ray detector 424 around an object. As such bending effectively increases the resolution of the bendable x-ray detector 424 and makes the features in an image effectively larger.

For systems that use extended (diverging) light source or a collimated light source, an aspect that needs to be taken in to consideration when bending a bendable x-ray detector is that after an imaging operation has captured an image, it is often difficult to determine the shape the bendable x-ray detector was in during the image capture operation just by examining the image. As a result, a user cannot know how image pixels have been distorted by the amount of bend or curved position, which makes interpretation of the image difficult for users accustomed to working with flat and/or rigid panels.

A solution to the issue of image distortion is disclosed herein by attaching and/or integrating strain (gauges) sensors into the bendable x-ray detector backplane to record strain sensor curvature during image capture, i.e., simultaneously or substantially simultaneously at the time of image capture. The known curvature can then be used to either correct and/or label distortions in an image created by the curvature of the x-ray detector. This is especially useful for freely flexible x-ray detectors that are not fixed in a position but can be positioned freely for each x-ray capture of an image.

In the described embodiments a plurality of strain sensors is used to provide a discretized strain measurement along the length and width (e.g., x and y axis locations) of the x-ray detector. The flexible x-ray detector is bendable but not stretchable; therefore, the x-ray detector can only be bent along one axis at a time and that bend radius will be constant along the direction perpendicular to the bend direction. As a result, just two lines of discreet strain sensors are required to record the bend position (e.g., location and amount of bend) of the x-ray (imager) detector.

Figure 5:
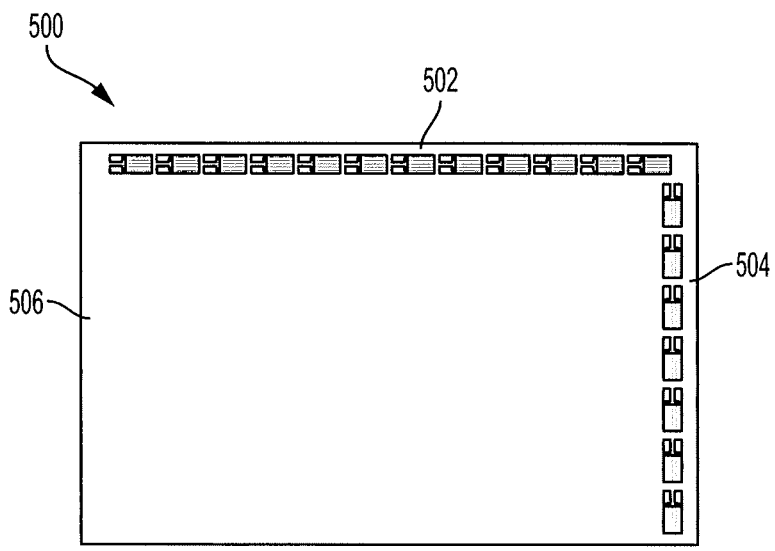
FIG. 5 is an embodiment of the placement of strain (gauges) sensors in order to measure strain for bends in both the x and y directions.

With more particularity to the foregoing discussion, attention is now directed to arrangement 500 of FIG. 5. A horizontal line of strain sensors 502 and a vertical line of strain sensors 504 are attached or integrated to a substantially planar surface (of a substrate or layer) 506. Stated alternatively, the arrangements of strain sensors are pixelated along two orthogonal axes oriented to the edges of the substrate or layer to detect the bend shape along either or both axes. In one non-limiting embodiment surface 506 being a bottom supporting layer of a flexible x-ray detecting structure (e.g., see layer 108 of FIG. 1).

In this non-limiting example, the strain sensors are therefore placed on the outermost layer of the flexible x-ray detector structure (i.e., again layer 108 of x-ray detector 100 of FIG. 1). By using this location, the strain sensors 502, 504 should always experience a maximum strain. Additionally, by placing the strain sensors behind the x-ray detector backplane (e.g., a-Si detector backplane 104 of FIG. 1) the strain sensors can be positioned on any location on a surface of substrate 506 without interfering with x-ray absorption.

Figure 6:
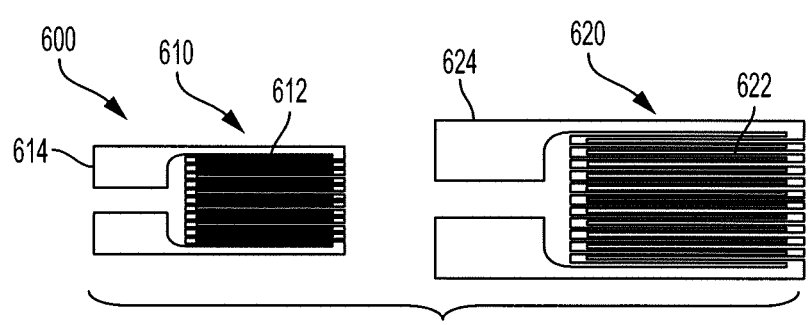
FIG. 6 provides examples of different sized meander strain (gauges) sensors.

With attention to the individual strain sensors that may be used, attention is directed to arrangement 600 of FIG. 6 illustrating individual differently sized strain sensors 610 and 620. As a non-limiting example, strain sensors 610, 620 are depicted as meander strain (gauges) sensors, which are well known in the art. They consist of a metal wire 612, 622 fabricated on flexible substrates 614, 624. When the substrates 614, 624 are bent, the overall length and width of the wire 612, 622 are altered, resulting in a measurable change in resistance (and/or voltage or current). By recording the resistance (and/or voltage or current) change and knowing the gauge factor of the strain sensor, the strain on the strain sensor can be determined. From the identified strain the local radius of curvature can be determined. In addition to being of different sizes it is understood the strain sensors used herein may have different sensitivities. It is also known that strain measured on particular strain sensors are, during manufacture, calibrated to correlate the resistance (and/or voltage or current) changes to the degrees a strain sensor has been bent.

In actual implementation of an x-ray (imager) detector using the arrangement 500 of FIG. 5 (i.e., with all the same sized, therefore same sensitivity stain sensors or different intermixed sensors), there will be a trade-off between resolution and sensitivity for the choice of the size of the strain sensor arrangement. Smaller sensor arrangements provide better resolution but less sensitivity.

Figure 7:
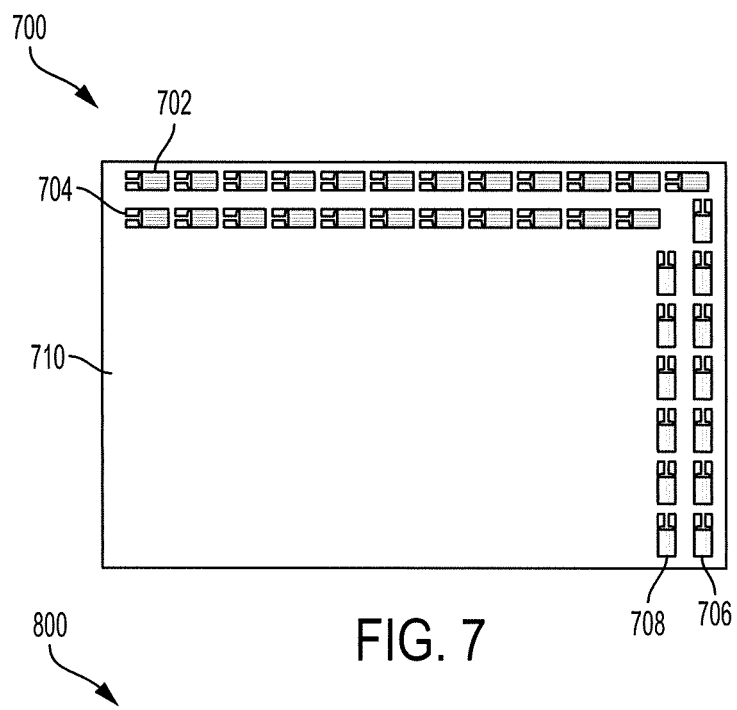
FIG. 7 is an embodiment of the placement of strain (gauges) sensors in order to measure strain for bends in both the x and y directions.

A particular non-limiting way to address this sensitivity/resolution trade-off is shown by arrangement 700 of FIG. 7, which includes more than the minimum of two lines of strain sensors attached/integrated with the x-ray detector (e.g., x-ray detector or imager 100 of FIG. 1). Rather as shown by arrangement 700 multiple horizontal lines of strain sensors 702, 704 and multiple vertical lines of strain sensors 706, 708 with different lengths are attached/integrated with a surface of a substrate or layer 710 (e.g., such as or similar to surface of substrate or layer 506 of FIG. 5), and are used to mitigate the discussed tradeoff by the increase of strain sensors being used. As also previously mentioned attaching and/or integrating the strain sensors behind the backplane (e.g., 104 of FIG. 1) gives complete freedom of placement for the strain sensors as they will not interfere with image acquisition.

Figure 8:
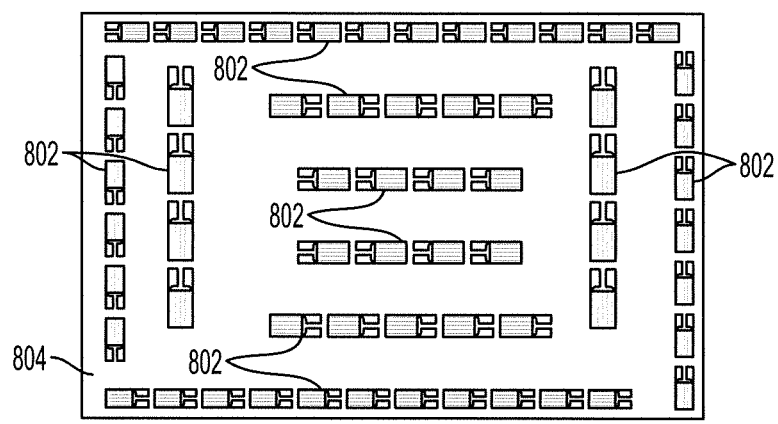
FIG. 8 is an embodiment of the placement of strain (gauges) sensors in order to measure strain for bends in both the x and y directions.

For another example attention is directed to arrangement 800 of FIG. 8. In this embodiment, multiple numbers of strain sensor arrangements 802 are mounted throughout surface 804 to provide additional data points. Also, as previously mentioned, by mounting the strain sensors behind the backplane (e.g., 104 of FIG. 1), complete freedom of placement is provided. The foregoing examples provide an illustration for the concept of pixelating of the strain sensors, by including multiple lines of decreasing size to get both high spatial resolution and high sensitivity across an x-ray detector or imager.

It is understood that connections or attachments used to read/download the data acquired by the strain sensor arrangements shown in FIGS. 5, 7, and 8 are made at the edges of the substrate surfaces (e.g., 506, 710, 804) using known data communication schemes. For example, a 4-point probe measurement arrangement, may be used where four wires come out from each individual strain sensor. Allowing measurement (e.g., voltage) across that strain sensors. Such readout may in certain embodiments be accomplished using a micro-controller, multiplexer, among other arrangements discussed herein and known in the art.

It is also understood that while surfaces of substrates or layers 506, 710 and 804 have been described as being a bottom supporting layer (e.g., underside protection layer 108 of FIG. 1), with the strain sensor arrangements attached or integrated to the outer side of such layer. The strain sensor arrangements may be attached or integrated elsewhere, such as on the inside of the bottom supporting layer, the outer or inner surface of the substrate 106 of FIG. 1, among other locations.

Also, it is mentioned that with regard to the arrangements of FIGS. 5, 7, and 8, the strain sensors are located on a completely different layer from the backplane 104 of FIG. 1. Of course, deciding particular locations of the strain sensors one would consider the desire to avoid interfering with the generation and capture of the image.

Turning now to another embodiment herein, the strain sensor structure is often a metal line with contact points for reading the resistance. This structure is simple enough to be integrated into the TFT backplane fabrication processes already being employed to manufacture the x-ray imager or detector. So the same processes can be used at the same time (e.g., simultaneously) to add strain sensors around the edges of, for example, the backplane or on other layers of the x-ray detector such as but not limited to the bottom supporting layer of FIG. 1.

Figure 9:
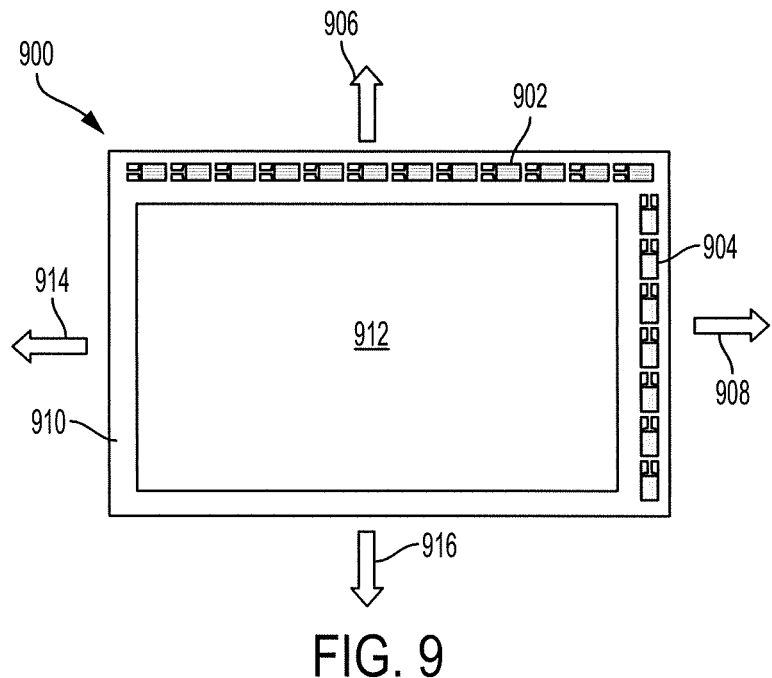
FIG. 9 depicts placement of strain (gauges) sensors to measure strain for bends in both the x and y directions, with inputs/outputs available on two edges of the device, with the other two edges providing inputs/outputs for the x-ray detectors.

Turning to the integration of strain sensors on the backplane, there are already at least two metal layers in the standard TFT backplane process for making the gate and data lines associated with the photodiodes of the backplane. These metal layers are typically Al or MoCr. In this embodiment, as shown by arrangement 900 of FIG. 9, two lines of strain sensors 902, 904 are added along two sides (e.g., corresponding to a plurality of data readout contacts represented by arrows 906, 908) on substrate or layer 910 in order to read out the data from the strain sensors 902, 904. Such process may use some manner of data readout, such as previously discussed and/or by use of a TFT array if appropriate. Also, represented in FIG. 9 is a backplane 912 which includes a photodiode/TFT array, having connection areas (data readout contacts represented by arrows 914, 916).

The above configuration means the strain sensors get automatically integrated into x-ray detector without adding additional manufacturing steps. However, there are also some potential issues. 1) If the x-ray imager or detector structure is designed so the TFT backplane sits in the neutral plane (as is described in U.S. patent application Ser. No. 15/951,407) then these strain sensors will not be able to measure sensor curvature. 2) Utilizing an already existing metal layer to fabricate the strain (gauges) sensors requires the strain sensors to be fabricated off the backplane on opposite sides of the gate and data contacts to prevent shorting to other structures in the metal layers. These extra non-imaging structures on the two contactless sides of the array will increase the side of the minimum edge of non-imaging dead area between the x-ray detector or imager and the edge of the substrate.

Figure 10:
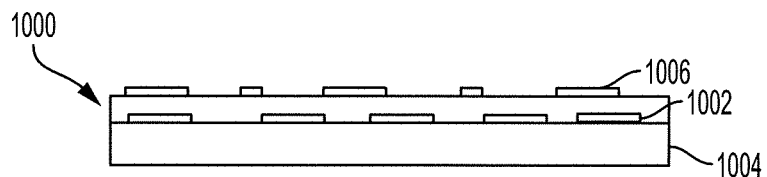
FIG. 10 illustrates strain (gauges) sensors provided using manufacturing/construction processes employed for manufacture/construction of the x-ray detector.

There are at least two ways to mitigate these issues. First, as shown in the arrangement 1000 of FIG. 10, the strain sensors 1002 can be fabricated on a third metal layer 1004 beneath the backplane structure 1006. Using the design of FIG. 10, strain sensors 1002 can be put throughout layer 1004. This design also separates inputs/outputs of for x-ray detector and the strain sensors, and their inputs and outputs. The embodiment of FIG. 10 does however increase the complexity of the manufacturing process by adding another patterning layer.

Figure 11:
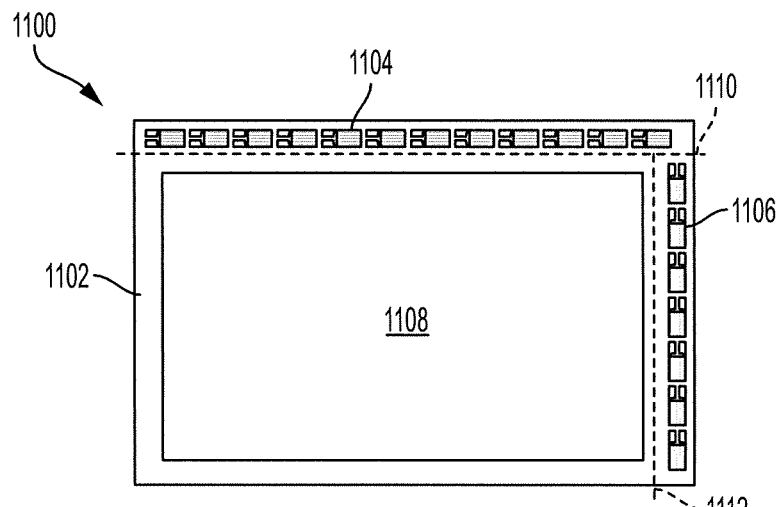
FIG. 11 illustrates placement of strain (gauges) sensors to measure strain corresponding to bends in both the x and y directions, using a folding technique.
Figure 12:
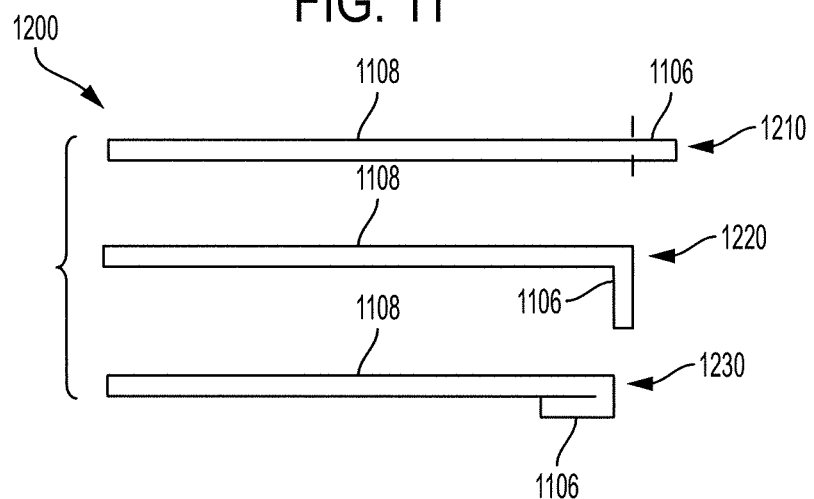
FIG. 12 provides side views for the embodiment of FIG. 9.

An alternative option is to create a structure with a folding area as shown in FIGS. 11 and 12. This fold is possible due to the flexible nature of the substrate, 106 (of FIG. 1). More particularly, as illustrated in arrangement 1100 of FIG. 11, substrate 1102 has formed thereon horizontal strain sensors 1104 and vertical strain sensors 1106, along with backplane (e.g., photodiodes/TFT array) 1108. Also depicted are horizontal fold line 1110 and vertical fold line 1112. As will be described in connection with FIG. 12, the process includes folding a portion of the substrate 1102 with the strain sensors under the backplane (e.g., photodiodes/TFT array) to recover the minimum edge. This mitigation strategy to decrease the dead area has the added aspect of moving the strain sensors out of the plane of the TFT backplane, so they will still experience strain when the strain sensors are bent, even if the imager stack-up is designed so the backplane sits in the neutral plane. The substrate 106 (FIG. 1), could even be bent around the edge of the stiffener layer, 108 (FIG. 1), to further increase the strain on the strain sensors.

FIG. 12 illustrates side views 1210, 1220, 1230 of one example of the folding concept described above (in FIG. 11) from the perspective of the vertical strain sensors 1106. Initially, in side view 1210, fold line 1112 distinguishes between the portions of substrate 1102 carrying the vertical strain sensors 1106 and the backplane (e.g., photodiodes/TFT arrangement) 1108. Next side view 1220 depicts the portion of the substrate 1102, carrying the vertical strain sensors 1106 is beginning to be folded in a downward direction, while the portion of substrate 1102 carrying the backplane 1108 remains in the same position. Finally, as illustrated in side view 1230, the vertical strain sensors 1106 are depicted as having been folded under the portion of substrate 1102 carrying the backplane 1108.

For convenience the edge with the horizontally carried strain sensors 1104 are not shown. It is understood however similar actions are applied to the horizontal strain sensors. Also, in some situations the area of the fold lines between the two sets of strain sensors may be cut in order to increase the efficiency of the fold operations. Additionally, the substrate 1102 may be made larger such that more strain sensors can be placed thereon and folded to the underside as described above. Still further in certain embodiments an insulation layer may be provided and placed between the backside of the unfolded and folded portions.

As understood in the art, data readout from a backplane (e.g., from the photodiodes/pixels and TFTs) can employ a matrix of TFTs to obtain data from specific photodiodes of the array of photodiodes. In this embodiment a second matrix of TFTs (distinct and separate from the TFTs associated with the backplane) are connected to the strain sensors to provide a multiplexed integrated readout scheme for the strain sensors, similar to but again separate from the matrix of TFTs used to read out image data (e.g., from the photodiodes).

Similar to the x-ray detector operation, TFTs associated with the strain sensors are used to address each strain sensor and to readout data therefrom sequentially. The TFTs associated with the strain sensors can be addressed with the same control sequence, and in certain embodiments, the same external hardware (but not the TFTs) as used for the image photodiodes/pixels. This has at least two advantages: 1) it guarantees simultaneous measurement of the curvature x-ray detector, and the optical image measurement, and 2) it allows the strain sensor data can be easily recorded as additional data in the same data structure as the optical image for simplified digital processing and correction. Use of the matrix type readout (similar to the matrix design for x-ray imager data readout) may be particularly useful when a large number of strain sensors are being employed.

Figure 13:
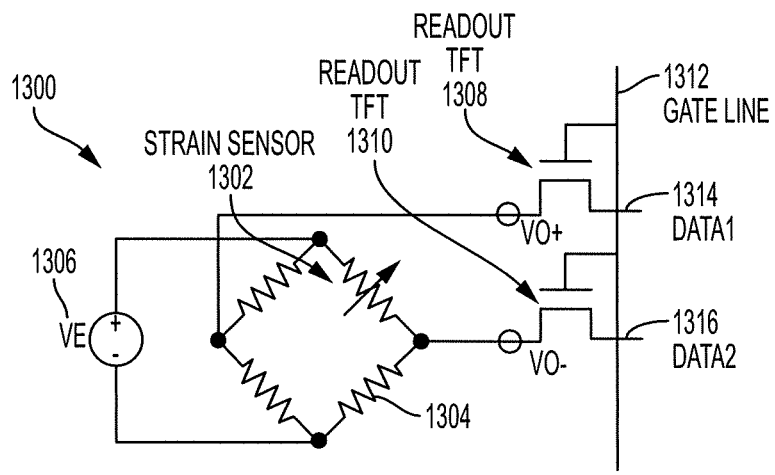
FIG. 13 illustrates a circuit arrangement for reading out strain (gauge) sensor data.
Figure 14:
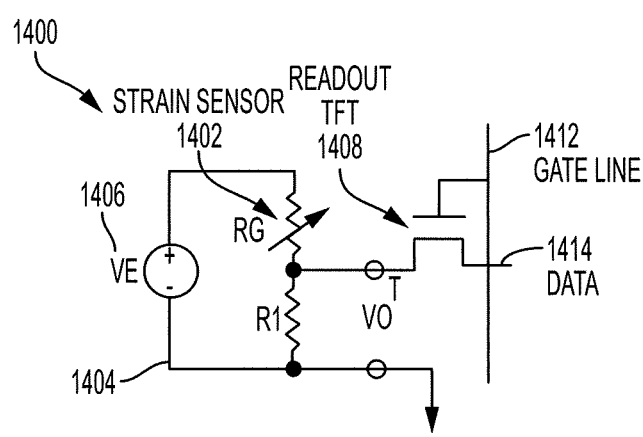
FIG. 14 illustrates a circuit arrangement for reading out strain (gauge) sensor data.

Turning to FIGS. 13 and 14, illustrated are circuit designs used for data readout from the strain sensors as discussed above.

FIG. 13 illustrates a bridge measurement configuration 1300. In circuit 1300, a strain sensor 1302 in a resistive bridge circuit 1304, is associated with a power source 1306, and readout TFTs 1308, 1310. The TFTs are connected to a gate line 1312 and data lines 1314, 1316 for selecting and reading out data from the associated strain sensor 1302. It is understood the gate line 1312, and data lines 1314, 1316, are part of a larger matrix circuit arrangement including a plurality of similarly arranged interconnected bridge measurement configurations.

Turning to FIG. 14, illustrated is a divider measurement configuration 1400. In circuit 1400, a strain sensor 1402 in a resistive divider circuit 1404, is associated with a power source 1406, and readout TFT 1408. The TFT 1408 is connected to a gate line 1412 and data line 1414, for selecting and reading out data from the associated strain sensor 1402. It is understood the gate line 1412, and data line 1414 are part of a larger matrix circuit arrangement including a plurality of similarly arranged interconnected divider measurement configurations.

When dealing with a flexible x-ray detector, which has added strain sensors as in the present disclosure to measure the strain over an area, the received data can be used to back out the exact bend radius at each point on the imager when the image was captured such that such information can be directly presented to a user, or that information may be used to alter/adjust the image so it will look like it came from a flat/rigid detector. It is known, for example, that the strain measured on particular strain sensors are, during manufacture, calibrated to correlate the voltage (and/or resistance or current) changes to a degree of strain sensor bend. Therefore, in one example, the structure being imaged is divided up into segments that are defined by each of the strain sensors (either individually or in some predetermined subgroup). This allows a determination of local strain based on the measurement data output from the strain sensors, permitting the shape of the bendable x-ray detector to be determined, i.e., the identified amount of bend of the x-ray detector is compared to the known unbent position of the x-ray detector, and this is used to determine the bend and therefore the shape of the now x-ray detector. Thus, the attachment and/or integration of strain sensors to a bendable/flexible x-ray detector allows for the determination of the x-ray detector shape at the time an image is acquired.

From the acquired information the image of the structure that was obtained using the curved x-ray detector may be reconstructed to match the view that would be seen if a flat/rigid x-ray detector had been used. The determination of the shape of the bendable x-ray detector at the time of image acquisition and the use of this information to alter/readjust the image information to that corresponding to a flat/rigid detector view can be accomplished, for example, by software loaded on the computing device 114 of FIG. 1, where the imaging software can correct and/or label image distortions created by the bending of the bendable x-ray detector.

The arrangement of the x-ray imager of FIG. 1 is a single detector configuration. It is to be appreciated that the material described herein may also be used in a multi-stacked (or stacked-up) x-ray detector, such as described in U.S. patent application Ser. No. 15/951,407. In this type of use, the strain sensor arrangements would be positioned after the final detector layer so as to not interfere with image detection, and so would have one strain sensor arrangement for a multi-stack (or stacked-up).

By incorporating strain sensors on the flexible x-ray detector, it is possible to record the local bend of the flexible x-ray detector at the same time when an image is taken. This shape information can be used to either label or correct for the image distortions created by bending the detector to assist users more accustomed to viewing images produced by flat rigid detectors.

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

What is claimed is:

1. A digital bendable x-ray detector comprising:
   a flexible substrate, a detector backplane formed on the flexible substrate, and one or more x-ray conversion layers;
   the x-ray detector having a first side directed towards an x-ray source and a second side directed away from the x-ray source; and
   an arrangement of multiple strain sensors attached to the x-ray detector, wherein the multiple strain sensors are mounted throughout a surface behind the x-ray detector to provide a number of data points based on a number of the multiple strain sensors, and wherein by mounting the multiple strain sensors behind the x-ray detector complete freedom of placement of the multiple strain sensors is obtained, the arrangement of the multiple strain sensors including multiple lines of decreasing size of the multiple strain sensors used to obtain both spatial resolution and a sensitivity, wherein the arrangement of the multiple strain sensors provide data regarding location and amount of bend occurring when the digital bendable x-ray detector is acquiring image data concerning a structure or object being imaged.

2. The x-ray detector according to claim 1 wherein the arrangement of the multiple strain sensors is configured to be measured simultaneously with an image acquisition to extract a bend shape of the x-ray detector when an image is acquired.

3. The x-ray detector according to claim 1 wherein the arrangement of the multiple strain sensors is positioned along two orthogonal axes oriented to the edges of the flexible substrate to detect a bend shape of the x-ray detector along either or both axes.

4. The x-ray detector according to claim 1 in which multiple rows of the multiple strain sensors of various sizes are used to achieve both a sensitivity and a resolution of a bend shape.

5. The x-ray detector according to claim 1 wherein the multiple strain sensors are located on the second side of the x-ray detector at a position that does not interfere with image acquisition.

6. The x-ray detector according to claim 1 wherein the multiple strain sensors are subsequently fabricated on the x-ray detector.

7. The x-ray detector according to claim 1 wherein the multiple strain sensors are fabricated simultaneously with a detector backplane fabrication process on the first side of the detector backplane in regions outside an active detector imaging area.

8. The x-ray detector according to claim 1 wherein the multiple strain sensors are fabricated simultaneously with the detector backplane fabrication process on the first side of the detector backplane under an active detector imaging area.

9. The x-ray detector according to claim 1 wherein the multiple strain sensors are fabricated simultaneously with the detector backplane fabrication process on the first side of the detector backplane and interspersed within an active detector imaging area.

10. The x-ray detector according to claim 1 wherein the multiple strain sensors are positioned at a location within a vertical stack-up to experience a maximum strain provided to the x-ray detector.

11. The x-ray detector according to claim 10 wherein the location of the multiple strain sensors is on an outer surface of a supporting layer of the x-ray detector.

12. The x-ray detector according to claim 1 wherein a first array of TFTs are associated with the detector backplane, and a second array of TFTs are associated with the multiple strain sensors, and wherein the first array of TFTs and the second array of TFTs are separate from each other.

13. A method of detecting a curve of a bendable x-ray detector as the x-ray detector is acquiring image data of a structure or object comprising:
   positioning a bendable x-ray detector in a curved position to acquire image data of a structure or object; and
   reading out data from an arrangement of multiple strain sensors attached or integrated with a layer of the x-ray detector, wherein the data corresponds to an amount of strain caused to the multiple strain sensors by the bending of the bendable x-ray detector corresponding to the shape of the structure or object, wherein the multiple strain sensors are mounted throughout a surface behind the x-ray detector to provide a number of data points based on a number of the multiple strain sensors, and wherein by mounting the multiple strain sensors behind the x-ray detector complete freedom of placement of the multiple strain sensors is obtained, the arrangement of the multiple strain sensors including multiple lines of decreasing size of the multiple strain sensors are used to obtain both spatial resolution and sensitivity.

14. The method according to claim 13 wherein the arrangement of the multiple strain sensors is configured to be measured with image acquisition by the x-ray detector, to extract the bend shape of the x-ray detector when an image is acquired.

15. The method according to claim 14 wherein a simultaneous measuring includes obtaining and recording the resistance change of the multiple strain sensors.

16. A digital bendable x-ray detector comprising:
   a flexible substrate,
   a detector backplane formed on the flexible substrate, and one or more x-ray conversion layers;
   the x-ray detector having a first side directed towards an x-ray source and a second side directed away from the x-ray source, wherein the x-ray detector is in a neutral plane; and
   an arrangement of multiple strain sensors attached to the x-ray detector, wherein the arrangement of the multiple strain sensors provide data regarding location and amount of bend occurring when the digital bendable x-ray detector is acquiring image data concerning a structure or object being imaged, wherein the arrangement of the multiple strain sensors including multiple lines of decreasing size of the multiple strain sensors are used to obtain both spatial resolution and a sensitivity.

17. The x-ray detector according to claim 16 wherein the multiple strain sensors are fabricated simultaneously with the detector backplane fabrication process on the first side of the detector backplane in regions outside an active detector imaging area and then an area with the multiple strain sensors is folded over to reduce dead area.

18. The x-ray detector according to claim 16 wherein the multiple strain sensors are externally fabricated and subsequently bonded to the detector backplane.

* * * * *